(12) United States Patent
Johnson

(10) Patent No.: US 6,518,111 B1
(45) Date of Patent: Feb. 11, 2003

(54) METHOD FOR MANUFACTURING AND STRUCTURE OF SEMICONDUCTOR DEVICE WITH DIELECTRIC DIFFUSION SOURCE AND CMOS INTEGRATION

(75) Inventor: Frank S. Johnson, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/029,560

(22) Filed: Dec. 20, 2001

(51) Int. Cl.[7] .......................... H01L 21/8238
(52) U.S. Cl. .................. 438/202; 438/207; 438/309
(58) Field of Search .......................... 438/202, 234, 438/309, 318, 207, 350; 257/565, 592, 593

(56) References Cited

U.S. PATENT DOCUMENTS

| | | | |
|---|---|---|---|
| 4,960,726 A | * 10/1990 | Lechaton et al. | 257/370 |
| 5,354,699 A | * 10/1994 | Ikeda et al. | 148/DIG. 9 |
| 5,593,905 A | 1/1997 | Johnson et al. | 437/31 |
| 6,239,477 B1 | 5/2001 | Johnson | 257/592 |

OTHER PUBLICATIONS

Johnson et al., "A Highly Manufacturable 0.25$\mu$m RF Technology Utilizing a Unique SiGe Integration," Presented Oct. 1, 2001, pp 1–4.

* cited by examiner

Primary Examiner—Wael Fahmy
Assistant Examiner—Hoai Pham
(74) Attorney, Agent, or Firm—Peter K. McLarty; W. James Brady III; Frederick J. Telecky, Jr.

(57) ABSTRACT

A method for manufacturing a semiconductor device includes forming a collector region of a semiconductor substrate and forming an isolation structure adjacent at least a portion of the collector region. The method also includes forming a gate stack layer adjacent at least a portion of the isolation structure and forming a base region of the semiconductor substrate adjacent at least a portion of the collector region. The base region comprises a base link up region proximate a lateral edge of the base region. A diffusion source layer is formed adjacent at least a portion of the base link up region. The method includes removing a portion of the gate stack layer to form a base electrode adjacent a portion of the base region and a gate electrode spaced apart from the base electrode. The gate electrode is located at a complementary metal oxide semiconductor (CMOS) area of the semiconductor device.

2 Claims, 2 Drawing Sheets

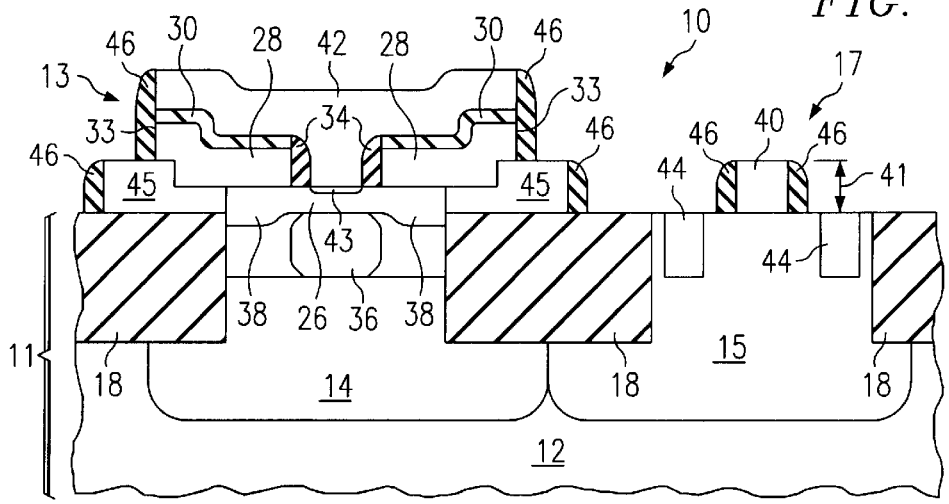

METHOD FOR MANUFACTURING AND STRUCTURE OF SEMICONDUCTOR DEVICE WITH DIELECTRIC DIFFUSION SOURCE AND CMOS INTEGRATION

TECHNICAL FIELD OF THE INVENTION

This invention relates generally to semiconductor devices and, more specifically, to a semiconductor device with a dielectric diffusion source and CMOS integration and a method for manufacturing the same.

BACKGROUND OF THE INVENTION

The demand for semiconductor devices to be made smaller is ever present because size reduction typically increases speed and performance. Moreover, reduction of the size of components of semiconductor devices can also increase packing density, allowing a manufacturer to produce wafers having more components.

Some semiconductor devices include multiple technologies, such as bipolar and complementary metal oxide semiconductor (CMOS) technologies, on the same device. In some manufacturing processes for such devices, independent steps are undertaken to manufacture the bipolar area and the CMOS area of the device. Each individual manufacturing step may be both time consuming and costly to a manufacturer.

SUMMARY OF THE INVENTION

The present invention provides a semiconductor device and method for manufacturing the same that substantially eliminates or reduces at least some of the disadvantages and problems associated with the previously developed semiconductor devices and methods for manufacturing the same.

In accordance with a particular embodiment of the present invention, a method for manufacturing a semiconductor device includes forming a collector region of a semiconductor substrate and forming an isolation structure adjacent at least a portion of the collector region. The method also includes forming a gate stack layer adjacent at least a portion of the isolation structure and forming a base region of the semiconductor substrate adjacent at least a portion of the collector region. The base region comprises a base link up region proximate a lateral edge of the base region. A diffusion source layer is formed adjacent at least a portion of the base link up region. The method includes removing a portion of the gate stack layer to form a base electrode adjacent a portion of the base region and a gate electrode spaced apart from the base electrode. The gate electrode is located at a complementary metal oxide semiconductor (CMOS) area of the semiconductor device.

In accordance with another embodiment, a semiconductor device includes a collector region of a semiconductor substrate and an isolation structure adjacent at least a portion of the collector region. The semiconductor device includes a base region adjacent at least a portion of the collector region. The base region comprises a base link up region proximate a lateral edge of the base region. The semiconductor device also includes a diffusion source layer adjacent at least a portion of the base link up region and a base electrode adjacent a portion of the base region. The semiconductor device includes a gate electrode spaced apart from the base electrode. The gate electrode is located at a complementary metal oxide semiconductor (CMOS) area of the semiconductor device. The base electrode and the gate electrode are formed by removing a portion of a gate stack layer located adjacent at least a portion of the isolation structure.

Technical advantages of particular embodiments of the present invention include a semiconductor device having a bipolar area and a complementary metal oxide semiconductor (CMOS) area. Particular steps in the formation of the bipolar area are integrated with the formation of the CMOS area. Such integration reduces the need for independent steps to form each area. Accordingly, time and expense associated with manufacturing the semiconductor device may be reduced.

Another technical advantage of particular embodiments of the present invention includes a semiconductor device with a diffusion source layer for a base link up region of a base region. The base region is self-aligned without selective epitaxy or chemical mechanical polishing (CMP). A dedicated base implant is not needed, thus additional time and expense associated with manufacturing the semiconductor device may be reduced. The semiconductor device can also be manufactured having a reduced size while still maintaining a high performance level.

Other technical advantages will be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of particular embodiments of the invention and their advantages, reference is now made to the following descriptions, taken in conjunction with the accompanying drawings, in which:

FIG. 1 is a cross-sectional diagram illustrating a semiconductor device with a dielectric diffusion source for a base link up region at one stage of a manufacturing process using CMOS integration, in accordance with a particular embodiment of the present invention;

FIG. 2 is a cross-sectional diagram illustrating a semiconductor device with a collector region, a well region and a gate polysilicon layer at one stage of a manufacturing process using CMOS integration, in accordance with a particular embodiment of the present invention;

FIG. 3 is a cross-sectional diagram illustrating the semiconductor device of FIG. 2 with a base layer at another stage of a manufacturing process using CMOS integration, in accordance with a particular embodiment of the present invention;

DETAILED DESCRIPTION OF THE INVENTION

Figure 4:
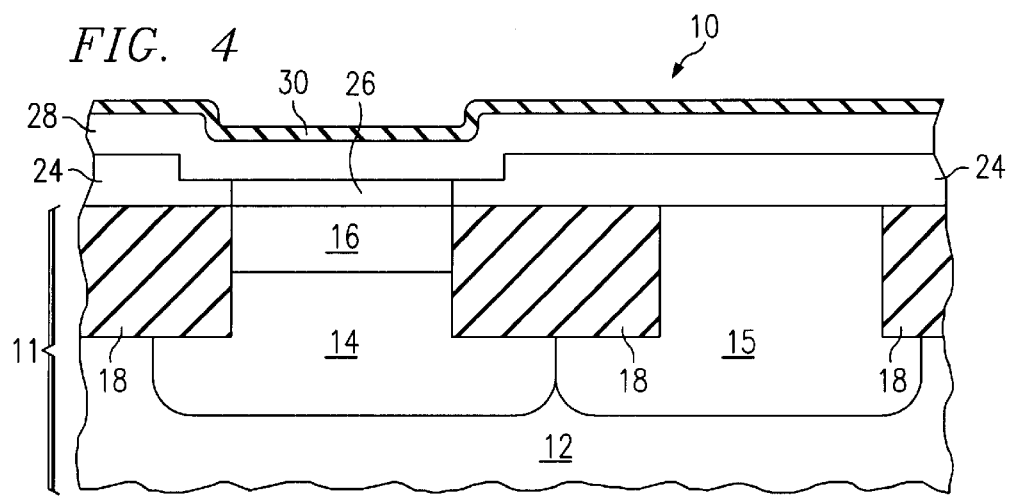
FIG. 4 is a cross-sectional diagram illustrating the semiconductor device of FIG. 3 with diffusion source layer and a cap layer at another stage of a manufacturing process using CMOS integration, in accordance with a particular embodiment of the present invention.

FIG. 1 illustrates a semiconductor device 10 at one stage of a manufacturing process, in accordance with an embodiment of the present invention. Semiconductor device 10 includes a bipolar area 13 and a complementary metal oxide semiconductor (CMOS) area 17. Semiconductor device 10 includes a dielectric diffusion source layer 28 separated from an polysilicon emitter 42 by a base emitter spacer 34. Diffusion source layer 28 serves as a dopant source for a base link up region 38. Thus, a dedicated implant for the base link up region is not needed. Base link up region 38 is also self-aligned to a base region 26, an emitter region 43 and a selective collector implant 36 without selective epitaxy or chemical mechanical polishing (CMP), saving time and expense in manufacturing.

Furthermore, particular steps in the formation of bipolar area 13 of semiconductor device 10 are integrated with the formation of CMOS area 17 through the formation of a gate stack layer which is patterned to form both a base electrode 45 for bipolar area 13 and a gate electrode 40 for CMOS area 17. Accordingly, time and expense associated with forming a semiconductor device having both bipolar and CMOS technology can be reduced, since independent steps may not be needed to form the base electrode and the gate electrode.

Semiconductor device 10 of FIG. 1 includes semiconductor substrate 11 which comprises a wafer 12. As discussed in further detail below, semiconductor device also includes a buried collector 14, a well region 15, isolation structures 18, cap layer 30, source/drain implants 44, spacers 46 and edges 33 of diffusion source layer 28 and cap layer 30. Other components of semiconductor device 10 are discussed below.

FIG. 2 illustrates semiconductor device 10 at one stage of a manufacturing process, in accordance with an embodiment of the present invention. Semiconductor substrate 11 comprises wafer 12, which is formed from a single crystalline silicon material. Semiconductor substrate 11 may comprise other suitable materials or layers without departing from the scope of the present invention. For example, semiconductor substrate 11 may include a recrystallized semiconductor material, a polycrystalline semiconductor material or any other suitable semiconductor material. In this embodiment, semiconductor substrate 11 has been lightly doped with boron to form a P– substrate. In other embodiments, the semiconductor substrate could be a P– epitaxially-grown layer on top of a P– or P+ substrate.

Buried collector 14 is formed within semiconductor substrate 11 using any of a variety of techniques well known to those skilled in the art. In the illustrated embodiment, buried collector 14 is an N+ buried collector doped with arsenic; however, in other embodiments buried collector 14 may be of another type, such as a P-type buried collector doped with dopants such as boron or indium. Other embodiments may not include a buried collector 14. Active area 16 is at a collection region of semiconductor device 10 and is either a lightly-doped or undoped active region adjacent buried collector 14.

Isolation structures 18 of semiconductor device 10 are formed as well. In the illustrated embodiment, isolation structures 18 are local oxidation on silicon ("LOCOS") isolation structures; however, other embodiments of the present invention may include different types of isolation structures, such as shallow trench isolation structures. LOCOS isolation structures 18 may be conventionally formed by growing a thin pad oxide upon semiconductor substrate 11 and depositing a thin nitride layer over the pad oxide. Photoresist is spun on and lithographically patterned to define field regions in which LOCOS isolation structures 18 are formed. The thin nitride layer is etched in the field regions with the pattern photoresist as the etch mask. The pattern photoresist is stripped and LOCOS structures 18 are grown in the field regions with the pattern nitride as the oxidation barrier.

Well region 15 is formed within semiconductor substrate 11. In the illustrated embodiment, well region 15 is a P-type region ("P-well"); however, in other embodiments, well region 15 may be an N-type region ("N-well"). In other embodiments, well region 15 may also be a deep N-type or a deep P-type region. Well region 15 may be formed by any of a variety of techniques well known to those skilled in the art, such as high energy implantation and/or diffusion.

A gate polysilicon is deposited upon semiconductor substrate 11 and patterned to form gate polysilicon layer 20 adjacent isolation structures 18. When the gate polysilicon is patterned, an emitter contact region 23 is formed surrounded by gate polysilicon layer 20. In other embodiments, buried collector 14 may be formed when patterning the gate polysilicon. Gate polysilicon layer 20 and a subsequently formed base layer will be patterned later in the manufacturing process to form a gate electrode for the CMOS area of semiconductor device 10. Gate polysilicon layer 20 has a thickness 21 which is less than the thickness of the gate electrode that will be subsequently formed.

FIG. 3 illustrates semiconductor device 10 of FIG. 2 at a further stage in the manufacturing process. Base layer 22 is formed upon semiconductor substrate 11. Base layer 22 is formed by growing epitaxially aligned crystal upon the substrate. In this embodiment, base layer 22 is composed of a silicon germanium crystal comprising a silicon crystal with between 0% and 20% germanium alloy at any given point. In other embodiments, base layer 22 may comprise any material that may epitaxially align with the silicon of active area 16.

As stated above, gate polysilicon layer 20 and base layer 22 will be patterned later in the manufacturing process to form a gate electrode on the CMOS area of semiconductor device 10. Such gate electrode will comprise portions of gate polysilicon layer 20 and base layer 22. Base layer 22 has a thickness 25. The combination of thickness 21 of gate polysilicon layer 20 and thickness 25 of base layer 22 equal the thickness of the subsequently formed gate electrode. Thickness 21 and thickness 25 may be varied in various embodiments to suit the particular technology being manufactured.

FIG. 4 illustrates semiconductor device 10 of FIG. 3 at a further stage in the manufacturing process. In FIG. 4, the portion of base layer 22 of FIG. 3 disposed upon active region 18 forms base region 26. Base region 26 is aligned to the silicon substrate beneath it. The portion of base layer 22 of FIG. 3 disposed above gate polysilicon layer 20 epitaxially aligns with the gate polysilicon layer 20 beneath it. The portion of gate polysilicon layer 20 and base layer 22 of FIG. 3 disposed above isolation structures 18 has no reference to which to align. Thus, its grain orientation is random, and it becomes gate stack lawyer 24. Gate stack layer 24 has a high diffusion coefficient for dopants, so dopants will diffuse through it quickly. Therefore, gate stack layer 24 may be an effective diffusion source for base link up of semiconductor device 10. In the illustrated embodiment, base layer 22 is formed using a non-selective epitaxy which saves manufacturing time and expense since a non-selective epitaxy is easier to control during the manufacturing process. However, other embodiments of the present invention may include forming a base layer using a selective epitaxy.

A diffusion source layer 28 is formed adjacent gate stack layer 24. Diffusion source layer 28 will provide a dopant source for a base link up region. In the illustrated embodiment, diffusion source layer 28 comprises a borosilicate glass; however in other embodiments diffusion source layer 28 may comprise another dielectric dopant diffusion source, such as silicon dioxide doped with phosphorous or silicon dioxide doped with boron. Diffusion source layer 28 may be doped in situ or implant doped after deposition. The material of diffusion source layer 28 may also be one that is suitable for selective removal from silicon.

A cap layer 30 is formed adjacent diffusion source layer 28. Cap layer 30 protects layer 18 from removal during subsequent processing and blocks the absorption of water vapor from the air into diffusion source layer 28. Cap layer 30 may comprise silicon nitride, tetraethyl orthosilicate (TEOS) or another dielectric material. In some embodiments, cap layer 30 may not comprise a dielectric material. Particular embodiments of the present invention may not include a cap layer 30.

Cap layer 30 and diffusion source layer 28 may have thicknesses that vary in various embodiments. In some embodiments cap layer 30 may have a smaller thickness than diffusion source layer 28, and in other embodiments cap layer 30 may have a larger thickness than diffusion source layer 28. The thicknesses of cap layer 30 and diffusion source layer 28 may depend on the particular application for which semiconductor device 10 is being manufactured.

Figure 5:
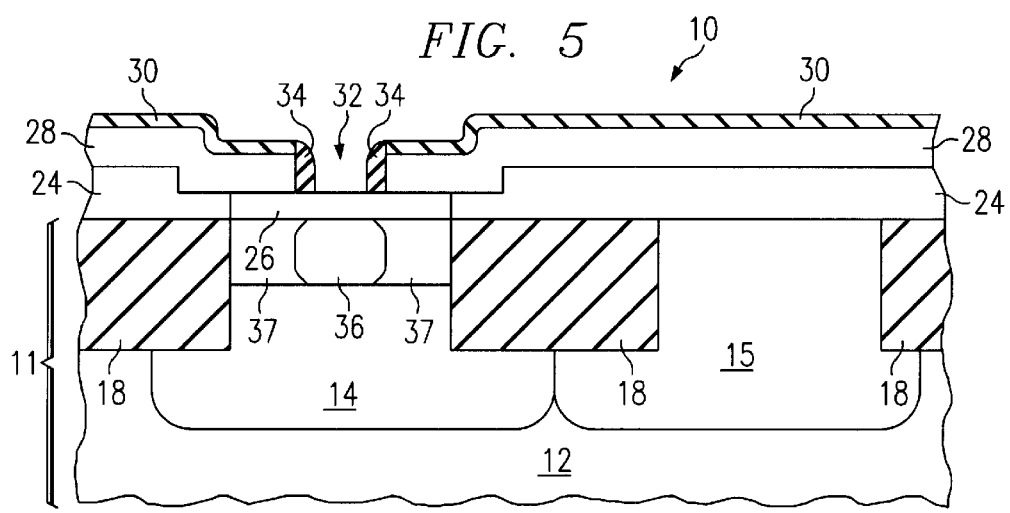
FIG. 5 is a cross-sectional diagram illustrating the semiconductor device of FIG. 4 with an emitter contact window and base emitter spacers at another stage of a manufacturing process using CMOS integration, in accordance with a particular embodiment of the present invention.

FIG. 5 illustrates semiconductor device 10 of FIG. 4 at a further stage in the manufacturing process. In FIG. 5, an emitter contact window 32 has been opened up by masking a portion of diffusion source layer 28 with photoresist and patterning and etching the portion of diffusion source layer 28 and cap layer 30 not masked by the photoresist. The etching process used to open emitter contact window 32 may be a combination of dry and wet etching techniques.

A selective collector implant 36 is implanted within active area 16 of FIG. 4. Selective collector implant 36 serves as a lightly-doped collector and contacts buried collector 14, a heavily-doped collector. Selective collector implant 36 is implanted below emitter contact window 32 and is surrounded by a peripheral region 37. By keeping selective collector implant 36 out of peripheral region 37, the parasitic capacitance of semiconductor device 10 may be reduced.

Selective collector implant 36 may be implanted after emitter contact window 32 is opened, using diffusion source layer 28 and cap layer 30 as the mask. In other embodiments, selective collector implant 36 may be implanted prior to opening emitter contact window 32.

Base emitter spacers 34 are formed adjacent diffusion source layer 28 and cap layer 30. In the illustrated embodiment, base emitter spacers 34 comprise a nitride; however in other embodiments base emitter spacers 34 may comprise other spacer materials. In this embodiment, base emitter spacers 34 are formed using a conventional deposition and isotropic etch back process. Base emitter spacers 34 serve to separate the emitter diffusion from the base link up diffusion described below.

Referring back to FIG. 1, semiconductor device 10 of FIG. 5 is illustrated at a further stage in the manufacturing process. A polysilicon material is deposited which is subsequently patterned to form a polysilicon emitter 42 overlapping base region 26. The polysilicon material may be deposited in situ doped, or it may be doped by implantation after the deposition. The polysilicon material may also be doped by diffusion following deposition. In this embodiment, the dopant may comprise any N-type dopant, such as arsenic. In other embodiments, the dopant for polysilicon emitter may comprise a P-type dopant.

During the patterning of the polysilicon material to form polysilicon emitter 42, portions of diffusion source layer 28 and cap layer 30 are also patterned. Such patterning removes the portions of diffusion source layer 28 and cap layer 30 outside of edges 33. In other embodiments, diffusion source layer 28 and cap layer 30 may be patterned before or after the patterning of the polysilicon material to form polysilicon emitter 42. For example, diffusion source layer 28 and cap layer 30 may be patterned before the deposition of the polysilicon material, or such portions may be patterned after polysilicon emitter 42 has been formed.

Gate stack layer 24 of FIG. 4 is patterned to form a gate electrode 40 for CMOS area 17 of semiconductor device 10. Such patterning may be accomplished by using masking and etching processes. As discussed above, gate electrode 40 has a thickness 41 approximately equal to the combination of thickness 21 of gate polysilicon layer 20 of FIG. 2 and thickness 25 of base layer 22 of FIG. 3. The area of gate stack layer 24 of FIG. 4 which is not removed (other than gate electrode 40) becomes a base electrode 45 used to contact base region 26 for bipolar area 13 of semiconductor device 10. Once a base link up region 38 has been formed from diffusion from diffusion source layer 28 (described below), then base region 26 may be electrically connected to a base contact through base link up region 38 and base electrode 45.

The patterning of gate stack layer 24 to form base electrode 45 and gate electrode 40 integrates the formation of bipolar area 113 with the formation of CMOS area 117. Such integration saves times and expense associated with manufacturing semiconductor device 10 since independent steps may not be needed to form the base electrode and the gate electrode of the different areas of the device.

Sidewall spacers 46 are formed adjacent polysilicon emitter 42, gate stack layer 24 and gate electrode 40. In the illustrated embodiment, sidewall spacers 46 comprise a nitride; however in other embodiments sidewall spacers 46 may comprise other spacer materials. Sidewall spacers 46 may be formed using a conventional deposition and isotropic etching process.

Semiconductor device 10 is subjected to an anneal process, or heat treatment, such as rapid thermal anneal (RTA) process. When this anneal process occurs, dopants in diffusion source layer 28 will diffuse into areas of base region 26 underlying diffusion source layer 28 to form a low resistance base link up region 38. Some diffusion will also occur from base link up region 38 laterally to partially under base emitter spacers 34. Additional diffusion may occur from diffusion source layer 28 to base electrode 45. An emitter region 43 will be formed from diffusion from polysilicon emitter 42. Emitter region 43 is a single crystalline emitter region. Base electrode 45 may also include combinations of dopants from one or more implants which may be shared, with one or more CMOS implants, such as source/drain implants 44.

The use of diffusion source layer 28 as a dopant source for base region 26 through base link up region 38 reduces the need for a dedicated implant for base region 26. Thus, additional time and expense associated with manufacturing semiconductor device 10 may be saved.

Furthermore, because the base diffusion is independent of the patterning of diffusion source layer 28, the combined size of base region 26 and base link up region 38 may be reduced since no alignment tolerances of base region 26 and base link up region 38 to emitter region 43 need to be accounted for in sizing the total area of the device. This can reduce the overall size of the device while still maintaining a high performance level.

Source/drain implants 44 are formed in accordance with techniques known to those skilled in the art. In the illustrated embodiment, source/drain implants 44 are N-type source/drain implants (NSD); however, in other embodiments source/drain implants 44 may be P-type source/drain implants (PSD).

Other standard processing steps can be undertaken in the manufacturing of semiconductor device 10. Such processing steps may include the formation of dielectric portions, silicide portions, threshold voltage implants, other implant regions and other layers and/or structures known to those skilled in the art. Other appropriate metal interconnections may be formed, and passivation may be undertaken. Other appropriate methods or steps may be performed to complete the manufacturing of semiconductor device 10.

Figure 6:
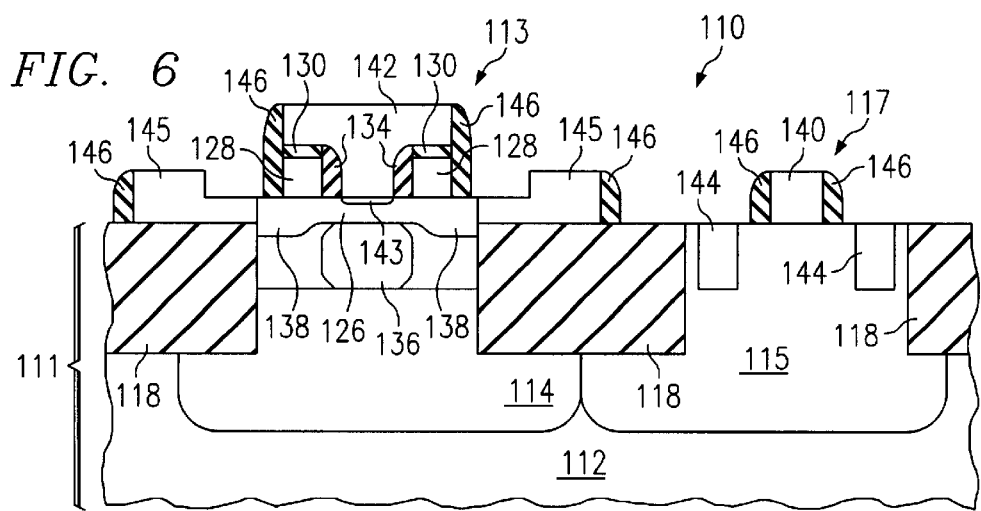
FIG. 6 is a cross-sectional diagram illustrating a semiconductor device with a dielectric diffusion source for a base link up region at one stage of a manufacturing process using CMOS integration, in accordance with another embodiment of the present invention.

FIG. 6 illustrates a semiconductor device 110 at one stage of a manufacturing process, in accordance with another embodiment of the present invention. The manufacturing process of semiconductor device 110 is similar to that of semiconductor device 10 discussed above. However, semiconductor device 110 includes a polysilicon emitter 142, diffusion source layer 128 and cap layer 130 which have been patterned and etched so that they are not located above base electrode 145. Semiconductor device 110 is different from semiconductor device 10 in this manner; because as illustrated in FIG. 1, semiconductor device 10 includes polysilicon emitter 42, diffusion source layer 28 and cap layer 30 located above a portion of base electrode 45. Patterning polysilicon emitter 142, diffusion source layer 128 and cap layer 130 of semiconductor device 110 in this manner will change the performance of semiconductor device 110 and thus make semiconductor device 110 more suitable for some applications.

Semiconductor device 110 includes bipolar area 113 and a CMOS area 117. Semiconductor device 110 also includes a semiconductor substrate 111 which comprises a wafer 112, a buried collector 114 and a well region 115. Semiconductor device 110 also includes LOCOS isolation structures 118, selective collector implant 136, emitter region 143, base region 126 and base link up region 138. Base emitter spacers 134 are located adjacent diffusion source layer 128 and cap layer 130. Gate electrode 140 and source/drain implants 144 are formed at CMOS area 117 of semiconductor device 110. Spacers 146 are located adjacent certain structure sidewalls of the device. Gate electrode 140 and base electrode 145 are formed similarly to gate electrode 40 and base electrode 45 of semiconductor device 10 discussed above.

Other standard processing steps can be undertaken in the manufacturing of semiconductor device 110. Such processing steps may include the formation of dielectric portions, silicide portions, threshold voltage implants, other implant regions and other layers and/or structures known to those skilled in the art. Other appropriate metal interconnections may be formed, and passivation may be undertaken. Other appropriate methods or steps may be performed to complete the manufacturing of semiconductor device 110.

Although the present invention has been described in detail, various changes and modifications may be suggested to one skilled in the art. It is intended that the present invention encompass such changes and modifications as falling within the scope of the appended claims.

What is claimed is:

1. A method for manufacturing a semiconductor device, comprising:

forming a collector region in a semiconductor substrate;

forming an isolation structure adjacent at least a portion of the collector region;

forming a gate stack layer adjacent at least a portion of the isolation structure wherein forming the gate stack layer comprises forming a gate polysilicon layer and forming a base layer adjacent the gate polysilicon layer;

forming a base region of the semiconductor substrate adjacent at least a portion of the collector region, wherein the base region comprises a base link up region proximate a lateral edge of the base region;

forming a diffusion source layer adjacent at least a portion of the base link up region; and removing a portion of the gate stack layer to form a base electrode adjacent a portion of the base region and a gate electrode spaced apart from the base electrode, wherein the gate electrode is located at a complementary metal oxide semiconductor (CMOS) area of the semiconductor device.

2. The method of claim 1, wherein the base layer comprises silicon germanium.

* * * * *